United States Patent [19]

Ohshima et al.

[11] Patent Number: 4,883,978
[45] Date of Patent: Nov. 28, 1989

[54] SEMICONDUCTOR DEVICE HAVING REDUCED POTENTIAL FLUCTUATIONS

[75] Inventors: Shigeo Ohshima; Hiroshi Sahara, both of Tokyo, Japan

[73] Assignee: Kabushiki Kaisha Toshiba, Kanagawa, Japan

[21] Appl. No.: 167,082

[22] Filed: Mar. 11, 1988

[30] Foreign Application Priority Data

Mar. 23, 1987 [JP] Japan .................................. 62-68254

[51] Int. Cl.$^4$ .......................................... H03K 17/16
[52] U.S. Cl. .................... 307/443; 307/453; 307/296.5; 307/303.2
[58] Field of Search ............ 307/200 B, 443, 448, 307/453, 263, 296 R, 303; 357/40, 45

[56] References Cited

U.S. PATENT DOCUMENTS

| | | | |
|---|---|---|---|
| 4,567,378 | 1/1986 | Raver | 307/263 X |
| 4,656,370 | 4/1987 | Kanuma | 307/443 X |
| 4,731,553 | 3/1988 | Van Lehn et al. | 307/443 X |
| 4,740,717 | 4/1988 | Fletcher et al. | 307/443 |
| 4,748,494 | 5/1988 | Yamada et al. | 357/45 X |
| 4,754,170 | 6/1988 | Toda et al. | 307/448 X |
| 4,758,743 | 7/1988 | Dehganpour et al. | 307/443 |
| 4,777,389 | 10/1988 | Wu et al. | 307/263 X |
| 4,785,201 | 11/1988 | Martinez | 307/263 X |

*Primary Examiner*—David Hudspeth
*Attorney, Agent, or Firm*—Banner, Birch, McKie & Beckett

[57] ABSTRACT

For a semiconductor integrated circuit having a data output buffer, separate power source pads and separate reference pads are provided for the data output buffer and the circuit components. Thus, any potential fluctuations or noise generated in the data output buffer are not transmitted to the circuit components, resulting in decreased circuit malfunction.

6 Claims, 3 Drawing Sheets

SEMICONDUCTOR DEVICE HAVING REDUCED POTENTIAL FLUCTUATIONS

BACKGROUND OF THE INVENTION

1. Field of the Invention

This invention generally relates to a semiconductor integrated circuit having a data output buffer, and in particular, it relates to a semiconductor integrated circuit wherein circuit malfunction is prevented by reducing the potential fluctuations generated at the power source of the circuit components during data output.

2. Description of the Prior Art

This application is related to a commonly assigned application entitled "Data Output Circuit" filed Mar. 11, 1988 and assigned Ser. No. 167,081. This application is also related to commonly assigned application Ser. No. 023,577 entitled "Buffer Circuit" filed on Mar. 9, 1987.

In semiconductor integrated circuits such as semiconductor memories, the prevention of circuit malfunction due to potential fluctuations in the power source is very important. Such potential fluctuations are generated when data is output from a data output buffer provided at the output stage of, for example, a semiconductor memory. During high-speed access, the output load must be rapidly charged and discharged. During this charging and discharging, potential fluctuations, i.e. power source noise, are generated in the power source and reference potentials respectively. These fluctuations may lead to malfunction of the semiconductor integrated circuit.

FIG. 1 is a circuit diagram of a conventional semiconductor integrated circuit such as a semiconductor memory. In the Figure, the area enclosed by broken lines contains the semiconductor circuit components and the associated output buffer. These semiconductor circuit components may include memory cells, address circuitry, sensing amplifiers, and circuitry for driving the output buffers. It is generally understood that output buffers do not comprise a portion of the internal semiconductor components. This convention will be observed in what follows, i.e., the output buffer is considered distinct from the internal semiconductor circuit components. T1 is a data output pad. T2 is a power source pad supplied with power source voltage $V_{DD}$. T3 is a reference pad supplied with reference voltage $V_{SS}$. I/O and Ī/O are internal data buses. MOS transistor 11 is a data output buffer for high-level output and MOS transistor 12 is a data output buffer for low-level output. Transistors 11 and 12 comprise an output switching means for coupling the circuit components to output terminal pad T1. AND gates 13 and 14 control the respective data outputs and comprise circuitry for driving the output buffers. Wiring 15 is associated with source voltage $V_{DD}$ and wiring 16 is associated with reference voltage $V_{SS}$. External D.C. power source 17 feeds power source voltage $V_{DD}$ to the integrated circuit. Capacitance 18 stabilizes power source 17. Load capacitance 19 is driven by the output data of the integrated circuit. External wiring and lead frame part 20 and bonding wire 21 couple data output pad T1 with load capacitance 19. Lead frame and external wiring part 22 and bonding wire 23 couple external D.C. power source 17 and power source pad T2. Lead frame and external wiring part 24 and bonding wire 25 couple external D.C. power source 17 with reference pad T3. Parasitic inductive and resistive components are present in lead frame and external wiring parts 20, 22, 24 and parasitic inductive components are present in bonding wires 21, 23, and 25. Parasitic resistive components are present in internal wirings 15 and 16.

When such an integrated circuit outputs high-level data, internal data bus I/O becomes level "1" while Ī/O becomes level "0". Subsequently, the internal control signal $\phi$ out rises to a level "1" causing the output signal of AND gate 13 to become a level "1". As a result, transistor 11 for high-level output, whose source and drain are inserted between power source pad T2 and data output pad T1, is turned on and conducts. Thus, node N1 at one end of load capacitance 19 gradually charges to a level "1" through transistor 11 and pad T1 as shown by the waveform of FIG. 2. During this process, "undershoot" of the power source voltage $V_{DD}$ occurs at node N2 as shown by the waveform of FIG. 2. This undershoot is potential fluctuations produced by the inductive and resistive components present in the lead frame and external wiring part 22, bonding wire 23 and internal wiring 15. The same undershoot also occurs at node N3 of wiring 16 on the reference voltage side.

In a similar manner, when low-level data is to be output, internal data bus I/O becomes level "0", while Ī/O becomes level "1". Subsequently, the internal control signal $\phi$ out rises to level "1", causing the output signal of AND gate 14 to become a level "1". As a result, transistor 12 for low-level output, whose source and drain are inserted between data output pad T1 and reference pad T3, is turned on and conducts. Thus, by the discharge of load capacitance 19, node N1 at one end thereof gradually discharges through transistor 12 and pad T1 to a level "0" as shown by the waveform of FIG. 3. During this process, "overshoot" of the reference voltage $V_{SS}$ occurs at node N3 as shown by the waveform of FIG. 3. This overshoot is potential fluctuations produced by the inductive and resistive components present in the lead frame and external wiring part 24, bonding wire 25 and internal wiring 16. The same overshoot also occurs at node N2 of wiring 15 on the power source voltage side. In general, because of the rapid discharge of the load capacitance, overshoot is a more serious problem than undershoot with potential fluctuations of greater magnitude over shorter time intervals.

Such power source noise may cause malfunction of the integrated circuit components and may also interfere with the stability of the external power source system, creating other undesirable effects.

SUMMARY OF THE INVENTION

Accordingly, an object of this invention is to provide a semiconductor integrated circuit designed to reduce circuit malfunction.

Another object of this invention is to provide a semiconductor integrated circuit with a data output buffer circuit in which the potential fluctuations generated at the power source of the circuit components during data output are reduced.

According to this invention, a semiconductor integrated circuit device includes a plurality of circuit components, the components being coupled to a common power source along the same first and second current paths. An output buffer comprising an output switching means is provided to couple the integrated circuit to an output terminal for supplying an output signal in response to a signal supplied by the integrated circuit. The output switching means includes two output electrodes, the first electrode being coupled to the common power source along a third current path and the second electrode being coupled to the common power source a fourth current path. The first and second paths are independent of the third and fourth paths.

BRIEF DESCRIPTION OF THE DRAWINGS

A more complete appreciation of the invention and many of the attendant advantages thereof will be obtained as the invention becomes better understood by reference to the following detailed description when considered in connection with the accompanying drawings, wherein.

DETAILED DESCRIPTION

Figure 1:
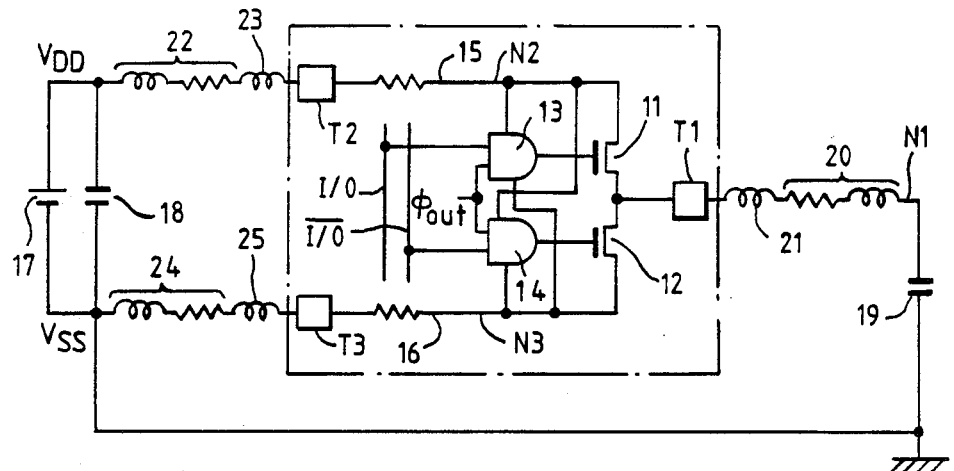
FIG. 1 shows a circuit diagram of a conventional circuit.
Figure 2:
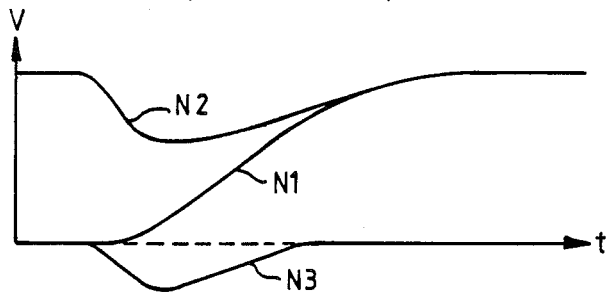
FIGS. 2 and 3 show waveforms obtained during operation of the conventional circuit shown in FIG. 1.
Figure 3:
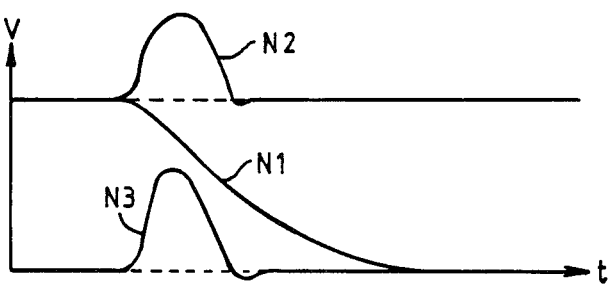
Figure 4:
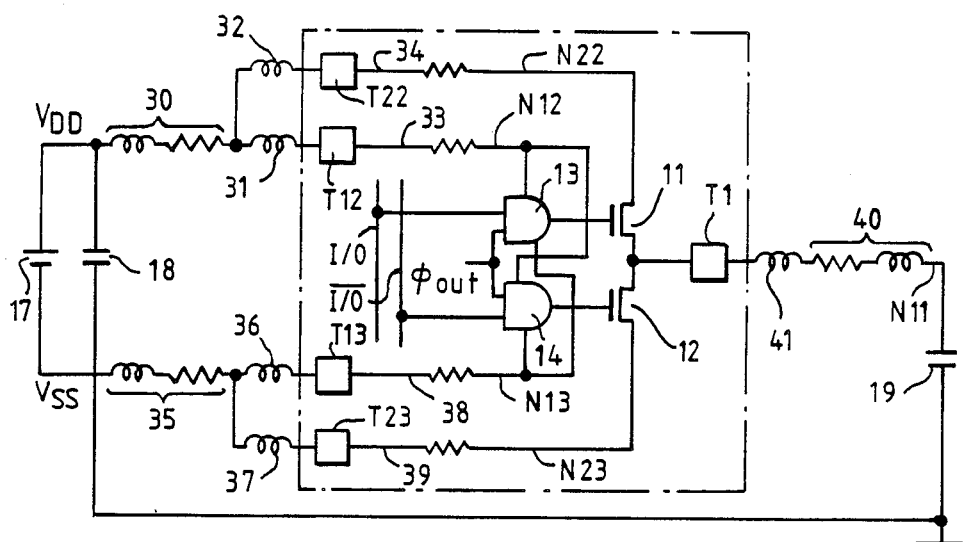
FIG. 4 shows a circuit diagram of an embodiment according to the present invention.

A semiconductor integrated circuit according to one embodiment of this invention will now be discussed with reference to FIG. 4.

In the Figure, T1 is a data output pad. T12 and T22 are power source pads supplied with power source voltage $V_{DD}$. T13 and T23 are reference pads supplied with reference voltage $V_{SS}$. I/O and I/O are internal data buses. Transistor 11 is a data output buffer for high-level output and transistor 12 is a data output buffer for low-level output. Transistors 11 and 12 comprise an output switching means for coupling the circuit components to output terminal pad T1. AND gates 13 and 14 control the respective data outputs and comprise circuitry for driving the output buffers. External D.C. power source 17 feeds power source voltage $V_{DD}$ to the integrated circuit. Capacitance 18 stabilizes power source 17. Load capacitance 19 is driven by the output data of the integrated circuit. The high potential side of external D.C. power source 17 is coupled to power source pad T12 by means of lead frame and external wiring part 30 and bonding wire 31. Power source 17 is also coupled to power source pad T22 by means of lead frame and external wiring part 30 and bonding wire 32, distinct from bonding wire 31. In the semiconductor integrated circuit, circuit components, such as AND gates 13 and 14, are coupled by means of internal wiring 33 to power source pad T12. A source or drain terminal of transistor 11 is coupled through internal wiring 34 to power source pad T22. The reference potential side of external D.C. power source 17 is coupled to reference pad T13 by means of lead frame and external wiring part 35 and bonding wire 36. Power source 17 is also coupled to reference pad T23 by means of lead frame and external wiring part 35 and bonding wire 37, distinct from bonding wire 36. Circuit components such as AND gates 13 and 14 are coupled by means of internal wiring 38 to reference pad T13. A source or drain terminal of transistor 12 is coupled through internal wiring 39 to reference pad T23. Load capacitance 19 is coupled to data output pad T1 by means of lead frame and external wiring part 40 and bonding wire 41. Parasitic inductive and resistive components are present in lead frame and external wiring parts 30, 35 and 40, and inductive components are present in bonding wires 31, 32, 36, 37 and 41. Parasitic resistive components are present in internal wirings 33, 34, 38, and 39. Specifically, in this embodiment, an independent power source pad T12 and reference pad T13 are provided for the semiconductor circuit components and an independent power source pad T22 and reference pad T23 are provided for the data output buffer comprising transistors 11 and 12. Power source pads T12 and T22 are coupled to external D.C. power source 17 by means of bonding wires 31 and 32, respectively, and the reference pads T13 and T23 are connected to external D.C. power source 17 by means of bonding wires 36 and 37 respectively.

Figure 5:
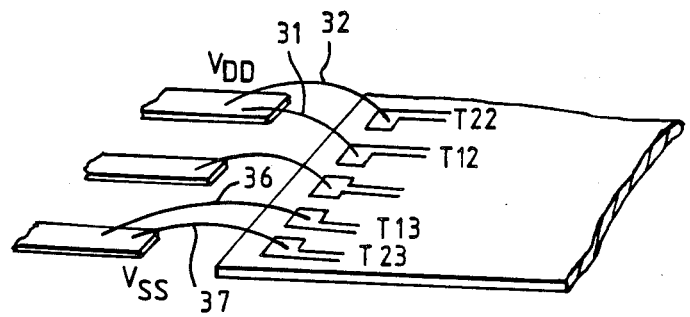
FIG. 5 shows a wiring connection according to the present invention.

FIG. 5 shows the connection of the $V_{DD}$ lead with power source pads T12 and T22 using bonding wires 31 and 32, and the connection of the $V_{SS}$ lead with reference pads T13 and T23 using bonding wires 36 and 37.

Figure 6:
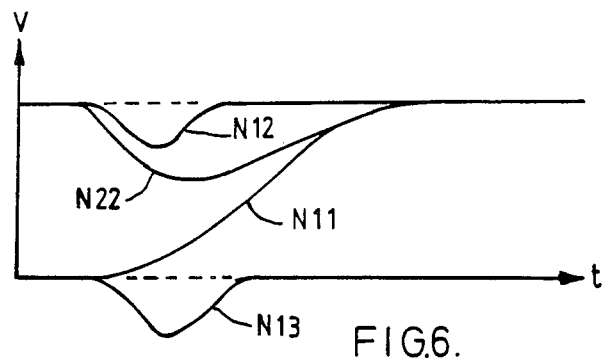
FIGS. 6 and 7 show waveforms obtained during operation of the above embodiment.

The operation of the circuit described above will now be discussed. First, the operation when high-level data is output from a memory of the above construction will be discussed using the wave-form of FIG. 6. During this process, internal data bus I/O is level "1" and I/O is level "0". Subsequently, the internal control signal $\phi$ out rises to level "1" and the output signal of AND gate 13 rises to level "1". Thus, transistor 11 is switched 11 is switched on and current flows through the path: external D.C. power source 17—lead frame and external wiring part 30—bonding wire 32—power source pad T22—internal wiring 34—transistor 11—data output pad T1—bonding wire 41—lead frame and external wiring part 40—load capacitance 19—$V_{SS}$. As a result, load capacitance 19 charges up to level "1" and the signal at node N11 also gradually rises to level "1". At this point, as in the conventional case, "undershoot" of a similar magnitude as in the conventional case occurs at node N22 of wiring 34 due to the inductive and resistive components present in the lead frame and external wiring part 30, bonding wire 32 and internal wiring 34. However, since the wiring 33 that supplies the power source voltage $V_{DD}$ to the circuit components is not on the path of the charging current through transistor 11, the effect of the potential fluctuations due to the inductive and resistive components present in bonding wire 31 and wiring 33 is small. Thus, the undershoot or potential fluctuations generated at node N12 or wiring 33 are much smaller than those generated at node N22. The undershoot at node N13 of wiring 38 is reduced by about the same extent as at node N12. It is therefore possible to prevent malfunction of the semiconductor circuit components when high-level data is output.

Figure 7:
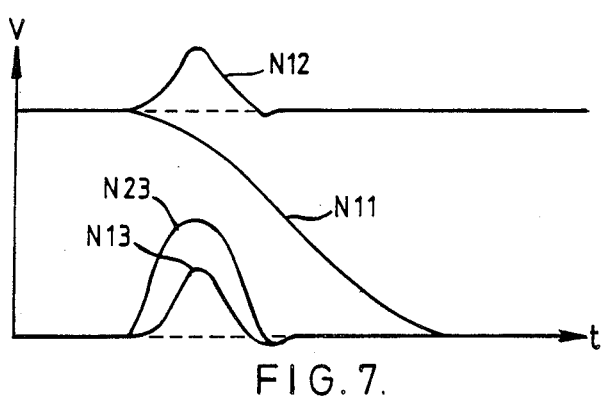

The operation when low-level data is output from a memory constructed as above will now be described with reference to the waveform of FIG. 7. During this process, the internal data bus I/O is at level "0" and the internal data bus I/O is at level "1". Subsequently, internal control signal $\phi$ out rises to level "1", causing the output signal of the AND gate 14 which controls low-level data out-put to rise to level "1". Thus, transistor 12 is switched on and current flows through the path: load capacitance 19—lead frame and external wiring part 40—bonding wire 41—data output pad T1—transistor 12—internal wiring 39—reference pad T23—bonding wire 37—lead frame and external wiring part 35. As a result, load capacitance 19 discharges to level "0" and the signal at node N11 gradually falls to level "0". In this process, overshoot of a similar magnitude as in the conventional case occurs at node N23 of internal wiring 39 due to the inductive and resistive components present in lead frame and external wiring part 35, bonding wire 37 and internal wiring 39. However, since wiring 38 that supplies reference voltage $V_{SS}$ to the internal circuitry is not on the path of the discharge current through transistor 12, the effect of the potential fluctuations due to the inductive and resistive components present in bonding wire 36 and wiring 38 is small. Thus, the potential fluctuations generated at node N13 of wiring 38 are much smaller than those generated at node N23. The fluctuations at node N12 or wiring 33 are reduced by about the same extent as at node N13. It is therefore possible to prevent malfunction of the semiconductor circuit components when level "0" data is output.

Figure 8:
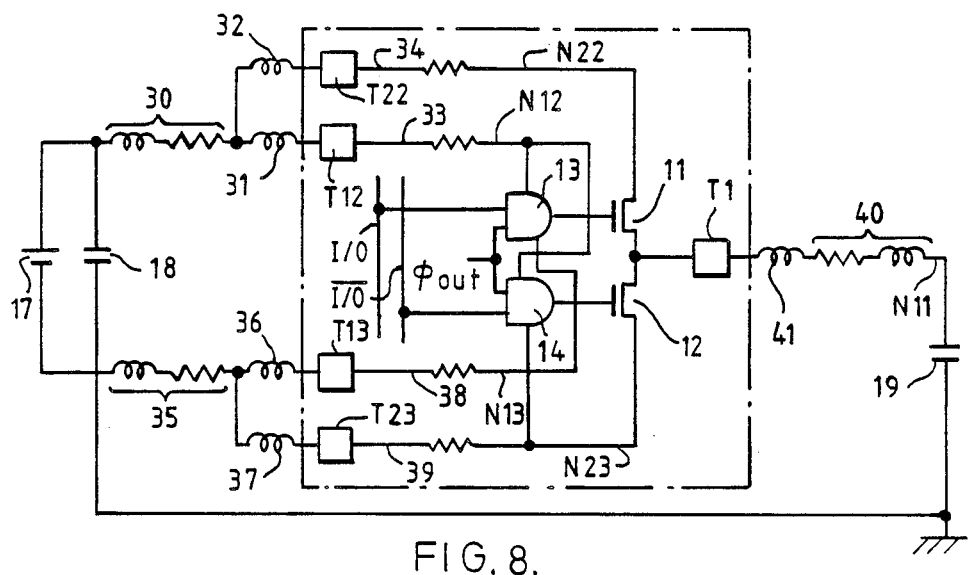
FIG. 8 shows the circuit diagram of another embodiment according to the present invention.

In the circuit of the above embodiment, transistor 12 for discharging load capacitance 19 is coupled to reference voltage $V_{SS}$ through reference pad T23. It is also desirable to connect AND gate 14, which generates the gate drive signal of transistor 12, to reference voltage $V_{SS}$ through reference pad T23. This is because when high-level data is output, the gate drive signal of transistor 12 is at the $V_{SS}$ level through the coupling with AND gate 14. However, if the $V_{SS}$ level is at the level of node N13, the potential difference between nodes N13 and N23, shown in FIG. 7, will be applied between the gate and source of transistor 12. If this potential difference exceeds the threshold voltage of transistor 12, there is a possibility that transistor 12 may turn ON. To avoid this risk, a construction may be adopted as in FIG. 8, in which AND gate 14 of the internal circuitry is coupled with reference pad T23, so that the $V_{SS}$ level is supplied to both the gate and source of transistor 12, eliminating the risk of transistor 12 turnong ON. Although the fluctuations at node N23 will be applied to AND gate 14, other circuit components remain coupled to reference voltage $V_{SS}$ through reference pad T13 and are thus subject to the reduced fluctuations at node N13. In addition, as noted, this configuration eliminates the risk that transistor 12 will be turned ON accidently.

Thus, by the circuits of the above embodiments, circuit component malfunction due to potential fluctuations generated in the power source voltage when data is output may be prevented. Potential fluctuations are particularly marked in multi-bit memory constructions having 4 or 8 output bits. This invention makes a considerable contribution to the suppression of output noise in such multi-bit systems. Furthermore, since potential fluctuations in the power source voltage supplied to the circuit components may be reduced, this invention is very beneficial when applied to high-speed DRAMs.

While the foregoing description is directed to only a few presently preferred embodiments, it will be obvious to one of ordinary skill that various modifications may be made without departing from the true spirit or scope of the invention which is to be limited only by the appended claims.

We claim:

1. A semiconductor device including a semiconductor integrated circuit having a plurality of circuit components, said device comprising:
   first and second power source pads coupled to the high potential side of an external power source by means of respective wirings;
   first and second reference pads coupled to the reference potential side of said external power source by means of respective wirings;
   a data output buffer having a data output terminal comprising first and second transistors coupled in series between the first power source pad and the first reference pad for supplying an output signal in response to a signal supplied by the semiconductor integrated circuit; and
   first and second gate circuits, each gate circuit associated with a respective one of said first and second series connected transistors for generating a signal to control the switching of the corresponding transistor, said gate circuits being circuit components of said semiconductor integrated circuit, said first gate circuit coupled between said second power source pad and said first reference pad, said second gate circuit and remaining circuit components coupled between said second power source pad and said second reference pad.

2. The semiconductor device according to claim 1 wherein said first series-connected transistor is coupled between the first power source pad and the data output terminal and said second series-connected transistors is coupled between the first reference pad and the data output terminal.

3. A semiconductor device including a semiconductor integrated circuit having a plurality of circuit components coupled to a common power source along the same first and second current paths, said device comprising:
   a data output buffer having a data output terminal comprising first and second switches coupled to the common power source along third and fourth current paths for supplying an output signal in response to a signal supplied by the semiconductor integrated circuit;
   first and second switch control circuits, each switch control circuit associated with a respective one of said first and second switches for generating a signal to control the switching of the corresponding switch, said first switch control means coupled to said power source along said first and second paths and said second switch control means coupled to said power source along said first and fourth paths, said first and second paths being independent of said third and fourth paths.

4. The semiconductor device according to claim 3 wherein said first and second switches comprise a first and a second transistor connected in series.

5. The semiconductor device according to claim 3 wherein said first and second switches control circuits comprise first and second gate circuits.

6. The semiconductor device according to claim 3 wherein said semiconductor integrated circuit comprises a memory having a multi-bit data output system.

* * * * *